(12) United States Patent
Lee et al.

(10) Patent No.: US 12,002,418 B2
(45) Date of Patent: Jun. 4, 2024

(54) DISPLAY DEVICE

(71) Applicant: Samsung Display Co., Ltd., Yongin-Si (KR)

(72) Inventors: Cheol Gon Lee, Yongin-si (KR); Hee Jean Park, Yongin-si (KR); Hee Rim Song, Yongin-si (KR); Yu Jin Lee, Yongin-si (KR); Mu Kyung Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/217,960

(22) Filed: Jul. 3, 2023

(65) Prior Publication Data

US 2023/0343277 A1    Oct. 26, 2023

Related U.S. Application Data

(63) Continuation of application No. 17/831,323, filed on Jun. 2, 2022, now Pat. No. 11,694,612.

(30) Foreign Application Priority Data

Sep. 17, 2021  (KR) .......................... 10-2021-0125074

(51) Int. Cl.
*G09G 3/32* (2016.01)
*G06V 40/13* (2022.01)
(52) U.S. Cl.
CPC .......... *G09G 3/32* (2013.01); *G06V 40/1318* (2022.01); *G09G 2300/0413* (2013.01); *G09G 2300/0809* (2013.01); *G09G 2330/028* (2013.01)

(58) Field of Classification Search
CPC ............ G09G 3/32; G09G 2300/0413; G09G 2300/0809; G09G 2330/028; G09G 2300/0452; G09G 2310/0251; G09G 2310/0262; G09G 2360/14; G09G 3/3233; G06V 40/1318; H10K 59/353; H10K 59/131
See application file for complete search history.

(56) References Cited

U.S. PATENT DOCUMENTS

| 2011/0148834 A1* | 6/2011 | Baek | ................... G09G 3/3406 345/207 |
|---|---|---|---|
| 2018/0090042 A1 | 3/2018 | Lin et al. | |

(Continued)

FOREIGN PATENT DOCUMENTS

KR    10-2021-0024310 A    3/2021

*Primary Examiner* — Andrew Sasinowski
(74) *Attorney, Agent, or Firm* — Innovation Counsel LLP

(57) ABSTRACT

A display device includes: pixel circuits arranged in a first direction on each of a first pixel row and a second pixel row; dummy sensor circuits arranged in a predetermined interval between the pixel circuits on the first pixel row; sensor circuits arranged in the interval between the pixel circuits on the second pixel row; light emitting elements disposed on the pixel circuits and connected to each of the pixel circuits; first light receiving elements on at least some of the pixel circuits of the first pixel row and the dummy sensor circuits; and second light receiving elements on at least some of the pixel circuits of the second pixel row and the sensor circuits. One of the sensor circuits is connected to at least two of the first light receiving elements and at least two of the second light receiving elements.

14 Claims, 8 Drawing Sheets

(56) References Cited

U.S. PATENT DOCUMENTS

| | | |
|---|---|---|
| 2018/0196931 A1 | 7/2018 | Cho et al. |
| 2018/0357460 A1 | 12/2018 | Smith et al. |
| 2019/0051250 A1 | 2/2019 | Lee |
| 2019/0189681 A1 | 6/2019 | Chae et al. |
| 2020/0143741 A1 | 5/2020 | Tsuboi et al. |
| 2020/0321387 A1 | 10/2020 | Jang |
| 2020/0394958 A1 | 12/2020 | Takahara et al. |
| 2021/0055826 A1 | 2/2021 | Park et al. |
| 2021/0064838 A1* | 3/2021 | Chen .................... G09G 3/3607 |
| 2022/0027598 A1* | 1/2022 | Lee .................... G06V 40/1388 |

\* cited by examiner

FIG. 2

| | R1 | R2 | R3 | R4 |
|---|---|---|---|---|
| | PXC18 | PXC28 | PXC38 | PXC48 |
| | PXC17 | PXC27 | PXC37 | PXC47 |
| | DSC12 | SC12 | DSC22 | SC22 |
| | PXC16 | PXC26 | PXC36 | PXC46 |
| | PXC15 | PXC25 | PXC35 | PXC45 |
| | PXC14 | PXC24 | PXC34 | PXC44 |
| | PXC13 | PXC23 | PXC33 | PXC43 |
| AS | DSC11 | SC11 | DSC21 | SC21 |
| | PXC12 | PXC22 | PXC32 | PXC42 |
| | PXC11 | PXC21 | PXC31 | PXC41 |

DR1 → , DR2 ↓

DISPLAY DEVICE

CROSS-REFERENCE TO RELATED APPLICATION

This application is a continuation application of U.S. patent application Ser. No. 17/831,323 filed on Jun. 2, 2022, which claims priority under 35 USC § 119 to Korean patent application 10-2021-0125074 filed on Sep. 17, 2021 in the Korean Intellectual Property Office, the disclosures of which are incorporated herein in their entirety by reference.

BACKGROUND

1. Technical Field

The present disclosure generally relates to a display device including a photo sensor.

2. Related Art

Demand for display devices for displaying images have been increasing in the recent past. This increase is, at least in part, driven by development of various electronic devices such as smartphones, digital cameras, notebook computers, navigation systems, and smart televisions, all of which incorporate one or more displays for user interface.

Recently, a technology for integrating and unifying a biometric sensor for recognizing a fingerprint or the like with a display panel occupying the widest area in a display device is researched and developed.

SUMMARY

Embodiments provide a display device including a dummy sensor circuit and a sensor circuit commonly connected to a plurality of light receiving elements.

In accordance with an aspect of the present disclosure, there is provided a display device including: pixel circuits arranged in a first direction on each of a first pixel row and a second pixel row; dummy sensor circuits arranged in a predetermined interval between the pixel circuits on the first pixel row; sensor circuits arranged in the period between the pixel circuits on the second pixel row; light emitting elements disposed on the pixel circuits and connected to each of the pixel circuits; first light receiving elements on at least some of the pixel circuits of the first pixel row and the dummy sensor circuits; and second light receiving elements on at least some of the pixel circuits of the second pixel row and the sensor circuits, wherein one of the sensor circuits is connected to at least two of the first light receiving elements and at least two of the second light receiving elements.

The sensor circuits may be disposed adjacent to the dummy sensor circuits in a second direction intersecting the first direction.

The sensor circuits and the dummy sensor circuits may be disposed on alternating pixel rows.

The dummy sensor circuits may be insulated from the first light receiving elements and the second light receiving elements.

At least four of the pixel circuits may be disposed between the dummy sensor circuits adjacent to each other in the first direction.

At least four of the pixel circuits may be disposed between the sensor circuits adjacent to each other in the first direction.

Each of the pixel circuits may include: a first pixel transistor receiving a first power voltage from a first power line and generating a driving current supplied to one of the light emitting elements; a second pixel transistor connected between a data line and a first electrode of the first pixel transistor, the second pixel transistor including a gate electrode connected to a corresponding first scan line; and a third pixel transistor connected between a gate electrode of the first pixel transistor and a second power line through which a second power voltage is provided, the third pixel transistor including a gate electrode connected to a corresponding second scan line. Each of the dummy sensor circuits may include: a first dummy sensor transistor connected to a third power line through which a third power voltage is provided; a second dummy sensor transistor connected between the first dummy sensor transistor and the third power line, the second dummy sensor transistor including a gate electrode connected to a first scan line of the first pixel row; and a third dummy sensor transistor connected between a fourth power line through which a fourth power voltage is provided and a gate electrode of the first dummy sensor transistor, the third dummy sensor transistor including a gate electrode connected to a control line.

Each of the sensor circuits may include: a first sensor transistor and a second sensor transistor, connected in series between the third power line and a readout line; and a third sensor transistor connected between the fourth power line, and two or more of the first light receiving elements and two or more of the second light receiving elements, the third sensor transistor including a gate electrode connected to the control line.

The second sensor transistor may include a gate electrode connected to a first scan line of the second pixel row.

The first sensor transistor may include a gate electrode connected to one electrode of the third sensor transistor.

Each of the pixel circuits may further include a fourth transistor connected between a second electrode of the first pixel transistor and the gate electrode of the first pixel transistor, the fourth transistor including a gate electrode connected to a corresponding third scan line.

The first light receiving elements and the second light receiving elements may be disposed on the same layer as the light emitting elements.

The dummy sensor circuits and the sensor circuits may be disposed on the same layer as the pixel circuits.

Two or more pixel rows may be located between two sensor pixels adjacent to each other in a second direction intersecting the first direction.

In accordance with another aspect of the present disclosure, there is provided a display device including: a backplane structure including pixel circuits, dummy sensor circuits, and sensor circuits; and a pixel layer provided on the backplane structure, the pixel layer including light emitting elements respectively connected to the pixel circuits and light receiving elements connected to the sensor circuits, wherein each of the sensor circuits is commonly connected to at least four of the light emitting elements.

The dummy sensor circuits and sensor circuits may be disposed on different pixel rows.

The dummy sensor circuits may be insulated from the light receiving elements.

At least four of the pixel circuits may be disposed between the sensor circuits adjacent to each other on the same pixel row.

Each of the pixel circuits may include: a first pixel transistor receiving a first power voltage from a first power line and generating a driving current supplied to one of the light emitting elements; a second pixel transistor connected between a data line and a first electrode of the first pixel transistor, the second pixel transistor including a gate electrode connected to a corresponding first scan line; and a third pixel transistor connected between a gate electrode of the first pixel transistor and a second power line through which a second power voltage is provided, the third pixel transistor including a gate electrode connected to a corresponding second scan line. Each of the dummy sensor circuits in a first pixel row may include: a first dummy sensor transistor connected to a third power line through which a third power voltage is provided; a second dummy sensor transistor connected between the first dummy sensor transistor and the third power line, the second dummy sensor transistor including a gate electrode connected to a first scan line of the first pixel row; and a third dummy sensor transistor connected between a fourth power line through which a fourth power voltage is provided and a gate electrode of the first dummy sensor transistor, the third dummy sensor transistor including a gate electrode connected to a control line.

Each of the sensor circuits in a second pixel row may include: a first sensor transistor and a second sensor transistor, connected in series between the third power line and a readout line; and a third sensor transistor connected between the fourth power line and at least four of the light receiving elements, the third sensor transistor including a gate electrode connected to the control line. The second sensor transistor may be connected to a first scan line of the second pixel row.

In the display device in accordance with the embodiments of the present disclosure, four or more light receiving elements may be connected to one sensor circuit formed in the backplane structure, so that the light receiving amount of the photo sensor may be increased while minimizing deterioration of a display resolution. Accordingly, the optical sensing performance of the display device may be improved.

Further, a dummy sensor circuit having a structure similar to that of the sensor circuit may be disposed in an area in which the existing sensor circuit is removed. Accordingly, the horizontal line blur caused by a capacitance difference between scan lines for data signal writing may be reduced, and the image quality of display device may be improved while improving the optical sensing performance.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it may be the only element between the two elements, or one or more intervening elements may also be present. Like reference numerals refer to like elements throughout.

FIG. 2 is a diagram illustrating an example of an arrangement of backplane circuits in a display area of a display panel included in the display device shown in FIG. 1.

DETAILED DESCRIPTION

Figure 1:
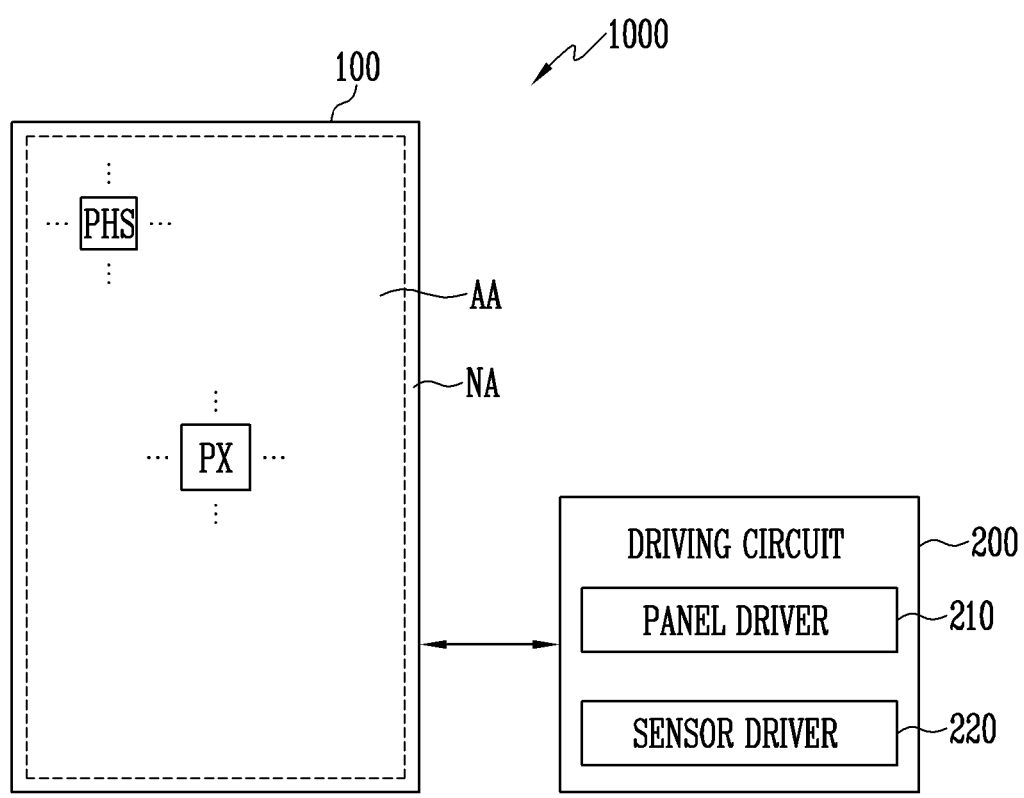
FIG. 1 is a block diagram illustrating a display device in accordance with embodiments of the present disclosure.

Hereinafter, exemplary embodiments of the present disclosure will be described in more detail with reference to the accompanying drawings. Throughout the drawings, the same reference numerals are given to the same elements, and their overlapping descriptions will be omitted.

FIG. 1 is a block diagram illustrating a display device in accordance with embodiments of the present disclosure.

Referring to FIG. 1, the display device 1000 may include a display panel 100 and a driving circuit 200. In one embodiment, the driving circuit 200 may include a panel driver 210 and a sensor driver 220.

The display device 1000 may be implemented as a self-luminous display device including a plurality of self-luminous elements. In particular, the display device 1000 may be an organic light emitting display device including organic light emitting elements. However, this is merely illustrative, and the display device 1000 may be implemented as a display device including inorganic light emitting elements, a display device including light emitting elements made of a combination of inorganic and organic materials, a liquid crystal display device, a plasma display device, a display device displaying an image by using a quantum dot, or the like.

The display device 1000 may be a flat panel display device, a flexible display device, a curved display device, a foldable display device, or a bendable display device. Also, the display device 1000 may be applied to a transparent display device, a head-mounted display device, a wearable display device, and the like.

The display panel 100 includes a display area AA and a non-display area NA. The display area AA may be an area in which a plurality of pixels PX (or may be referred to as sub-pixels) are provided. Each of the pixels PX may include at least one light emitting element. For example, the light emitting element may include a light emitting layer (or organic light emitting layer). A portion at which light is emitted by the light emitting element may be defined as a light emitting area. The display device 100 may drive the pixels PX, corresponding to image data, thereby displaying an image in the display area AA.

The non-display area NA may be an area provided at the periphery of the display area AA. In one embodiment, the non-display area NA may inclusively mean the other area except the display area AA on the display panel 100. For example, the non-display area NA may include a line area, a pad area, various dummy areas, and the like.

In one embodiment, a photo sensor PHS (or may be referred to as a sensor pixel) may be included in the display area AA. The photo sensor PHS may include a light receiving element including a light receiving layer. The light receiving layer of the light receiving element may be disposed to be spaced apart from the light emitting layer of the light emitting element in the display area AA.

In one embodiment, a plurality of photo sensors PHS may be distributed throughout the whole of the display area AA while being spaced apart from each other. However, this is merely illustrative, and only a portion of the display area AA may be set as a predetermined sensing area. The photo sensors PHS may be provided in the corresponding sensing area. In addition, the photo sensor PHS may be included in at least a portion of the non-display area NA.

In one embodiment, the photo sensors PHS may sense that light emitted from a light source (e.g., a light emitting element) is reflected by an external object (e.g., a finger of a user, or the like). For example a fingerprint of the user may be sensed through the photo sensor PHS. Hereinafter, a case where the photo sensors PHS are used for fingerprint sensing is described as an example in the present disclosure. In various embodiments, various biometric information such as an iris and a veins may be sensed through the photo sensors PHS.

The display device 1000 may include the panel driver 210 and the sensor driver 220. Although FIG. 1 illustrates a case where the panel driver 210 and the sensor driver 220 are separate from each other, the technical scope of the present disclosure is not limited thereto. For example, at least a portion of the sensor driver 220 may be included in the panel driver 210, or operate in connection with the panel driver 210 in some embodiments.

The panel driver 210 may scan the pixels PX of the display area AA, and supply a data signal corresponding to image data (or an image) to the pixels PX. The display panel 100 may display an image corresponding to the data signal.

In one embodiment, the panel driver 210 may supply a driving signal for optical sensing (e.g., fingerprint sensing) to the pixels PX. The driving signal may be provided to allow the pixels PX to operate as a light source for the photo sensor PHS by emitting light. In one embodiment, the panel driver 210 may supply, to the photo sensor PHS, the driving signal for optical sensing and/or another driving signal. However, this is merely illustrative, and the driving signal for optical sensing may be provided by the sensor driver 220.

The sensor driver 220 may detect biometric information such as the fingerprint of the user, based on a sensing signal received from the photo sensors PHS. In one embodiment, the sensor driver 220 may supply the driving signal to the photo sensor PHS and/or the pixel PX.

Figure 3:
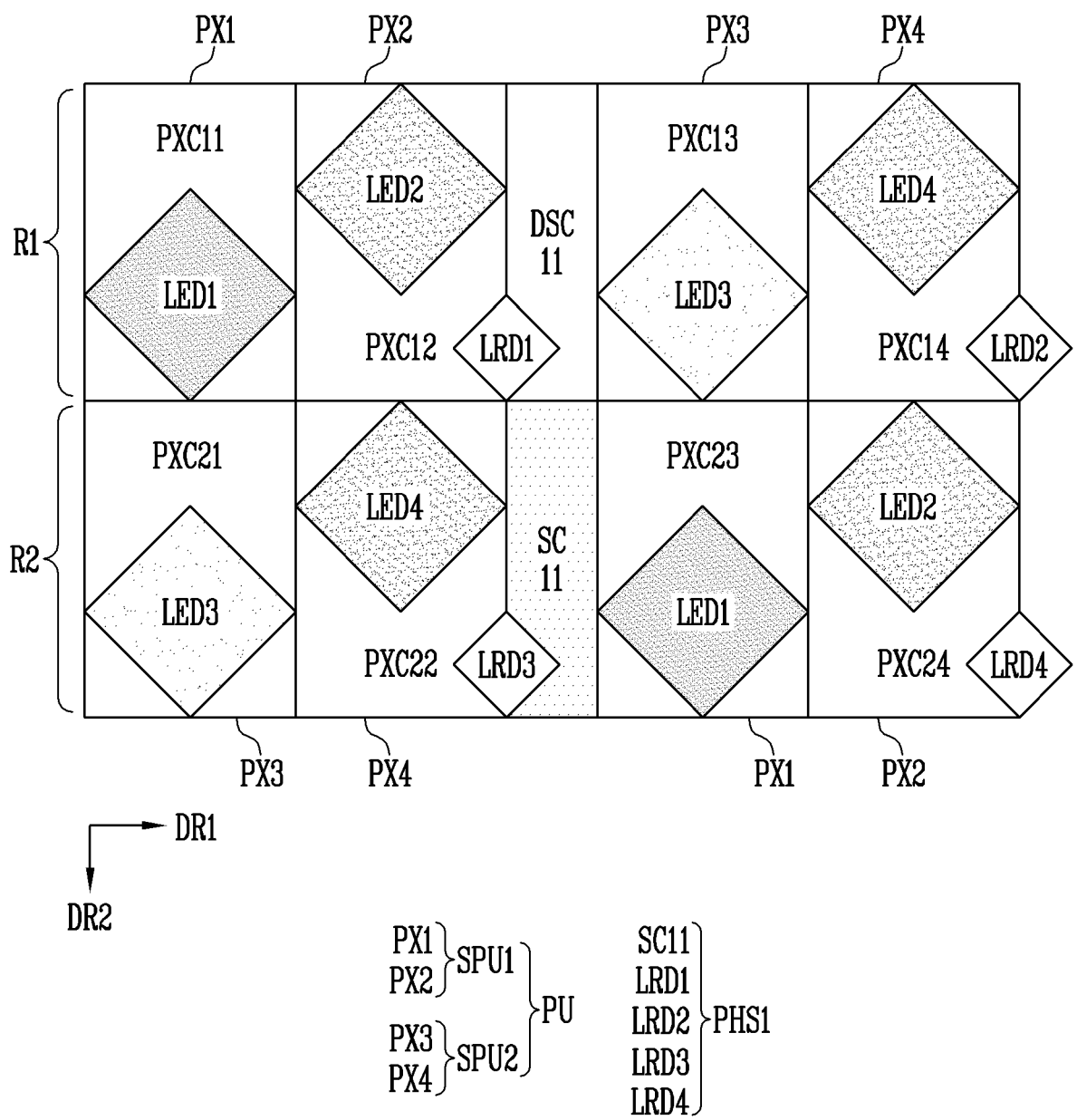
FIG. 3 is a diagram illustrating an example of the display area of the display panel included in the display device shown in FIG. 1.

FIG. 2 is a diagram illustrating an example of an arrangement of backplane circuits in the display area of the display panel included in the display device shown in FIG. 1. FIG. 3 is a diagram illustrating an example of the display area of the display panel included in the display device shown in FIG. 1.

Referring to FIGS. 1, 2, and 3, a plurality of pixels PX1, PX2, PX3, and PX4 and a plurality of photo sensors PHS may be disposed in the display area AA of the display panel 100.

The display area AA may be divided into a plurality of pixel rows R1 to R4. Each of the pixel rows R1 to R4 may extend in a first direction DR1, and the pixel rows R1 to R4 may be arranged in a second direction DR2. Each of the pixel rows R1 to R4 may include pixels PX1, PX2, and PX4. Each of the pixels PX1, PX2, PX3, and PX4 may include one of pixel circuits PXC11 to PX48 and one of light emitting elements LED1 to LED4.

In one embodiment, a first pixel PX1, a second pixel PX2, and a third pixel PX3 may emit first color light, second color light, and third color light, respectively. The first color light, the second color light, and the third color light may be different color lights, and each of the first color light, the second color light, and the third color light may be one of red, green, and blue. In one embodiment, a fourth pixel PX4 may emit the same color light as the second pixel PX2. For example, a first light emitting element LED1 may emit the first color light, a second light emitting element LED2 and a fourth light emitting element LED4 may emit the second color light, and a third light emitting element LED3 may emit the third color light.

In FIG. 3, each of the first to fourth light emitting elements LED1 to LED4 may be understood as a light emitting area corresponding to a light emitting layer. However, this is merely for convenience of description, and the colors of lights emitted from the first to fourth light emitting elements LED1 to LED4 and the positions, areas, shapes, and the like of the first to fourth light emitting elements LED1 to LED4 are not limited thereto.

In one embodiment, the pixels PX1, PX2, PX3, and PX4 may be arranged in the first direction DR1 in an order of the first pixel PX1 emitting red light, the second pixel PX2 emitting green light, the third pixel PX3 emitting blue light, and the fourth pixel PX4 emitting the green light on each of odd-numbered pixel rows including a first pixel row R1 (or first horizontal line) and a third pixel row R3 (or third horizontal line).

The pixels PX1, PX2, PX3, and PX4 may be arranged in the first direction DR1 in an order of the third pixel PX3, the fourth pixel PX4, the first pixel PX1, and the second pixel PX2 on each of odd-numbered pixel rows including a second pixel row R2 (or second horizontal line) and a fourth pixel row R4 (or fourth horizontal line).

In one embodiment, the first pixel PX1 and the second pixel PX2 may constitute a first sub-pixel unit SPU1, and the third pixel PX3 and the fourth pixel PX4 may constitute a second sub-pixel unit SPU2. Therefore, the first sub-pixel unit SPU1 and the second sub-pixel unit SPU2 may be alternately disposed on the odd-numbered pixel rows R1 and R3, and the second sub-pixel unit SPU2 and the first sub-pixel unit SPU1 may be alternately disposed in a pattern opposite to that of the odd-numbered pixel rows R1 and R3 on the even-numbered pixel rows R2 and R4.

It will be understood that predetermined first and second sub-pixel units SPU1 and SPU2 adjacent to each other include the first to fourth pixels PX1 to PX4, and constitute one pixel unit PU for convenience of description. For example, FIG. 3 shows a pixel unit PU of each of the first pixel row R1 and the second pixel row R2.

However, this is merely illustrative, and the arrangement of pixels is not limited thereto.

Pixel circuits PXC11 to PXC18 respectively corresponding to the pixels PX1, PX2, PX3, and PX4 of the first pixel row R1 may be arranged in the first direction DR1 on the first pixel row R1. Pixel circuits PXC21 to PXC28 respectively corresponding to the pixels PX1, PX2, PX3, and PX4 of the second pixel row R2 may be arranged in the first direction DR1 on the second pixel row R2. Similarly, pixel circuits PXC31 to PXC38 and PXC41 to PXC48 respectively corresponding to the pixels PX1, PX2, PX3, and PX4 of the third and fourth pixel rows R3 and R4 may be arranged in the first direction DR1 on the third and fourth pixel rows R3 and R4.

In FIG. 2, first to fourth pixel circuits PXC11 to PXC14 of the first pixel row R1 may be included in one pixel unit PU, and fifth to eighth pixel circuits PXC15 to PXC18 of the first pixel row R1 may be included in another pixel unit PU.

Similarly, first to fourth pixel circuits PXC21 to PXC24 of the second pixel row R2, fifth to eighth pixel circuits PXC25 to PXC28 of the second pixel row R2, first to fourth pixel circuits PXC31 to PXC34 of the third pixel row R3, fifth to eighth pixel circuits PXC35 to PXC38 of the third pixel row R3, first to fourth pixel circuits PXC41 to PXC44 of the fourth pixel row R4, and fifth to eighth pixel circuits PXC45 to PXC48 of the fourth pixel row R4 may also be included in different pixel units PU.

In one embodiment, each of the pixel rows R1 to R4 may include light receiving elements LRD1 to LRD4. In FIG. 3, each of first to fourth light receiving elements LRD1 to LRD4 may be understood as a light receiving area corresponding to a light receiving layer. However, this is merely for convenience of description, and the positions, areas, shapes, and the like of the first to fourth light receiving elements LRD1 to LRD4 are not limited thereto.

Each of light receiving elements LRD1 and LRD2 of the first pixel row R1 may overlap with at least some of the pixel circuits PXC11 to PXC18 of the first pixel row R1 and dummy sensor circuits DSC11 and DSC12) of the first pixel row R1. Each of light receiving elements LRD3 and LRD4 of the second pixel row R2 may overlap with at least some of the pixel circuits PXC21 to PXC28 of the second pixel row R2 and sensor circuits SC11 and SC12 of the second pixel row R2.

In one embodiment, the first light receiving element LRD1 may overlap with at least a portion of a first dummy sensor circuit DSC11 of the first pixel row R1, and the third light receiving element LRD3 may overlap with at least a portion of a first sensor circuit SC11 of the second pixel row R2.

Referring to FIGS. 2 and 3 together, the second light receiving element LRD2 may overlap with at least a portion of the fourth and fifth pixel circuits PXC14 and PXC15 of the first pixel row R1, and the fourth light receiving element LRD4 may overlap with at least a portion of the fourth and fifth pixel circuits PXC24 and PXC25 of the second pixel row R2.

The first to fourth light receiving elements LRD1 to LRD4 may be formed in an arrangement shown in FIG. 3 in the display area AA.

In one embodiment, sensor circuits SC11, SC12, SC21, and SC22 may be disposed on the second pixel row R2 and the fourth pixel row R4. Each of the sensor circuits SC11, SC12, SC21, and SC22 may be connected to at least four light receiving elements. For example, the first sensor circuit SC11 of the second pixel row R2 may be commonly connected to the first to fourth light receiving elements LRD1 to LRD4. That is, a detection current (or detection voltage) generated by the first to fourth light receiving elements LRD1 to LRD4 may be detected by one first sensor circuit SC11. In other words, a first photo sensor PHS1 may include first to fourth light receiving elements LRD1 to LRD4 and one sensor circuit (e.g., SC11).

The first sensor circuit SC11 of the second pixel row R2 may be disposed between the first sub-pixel unit SPU1 and the second sub-pixel unit SPU2, which are included in the pixel unit PU. For example, the first and second pixel circuits PXC21 and PXC22 of the second pixel row R2 may be included in the second sub-pixel unit SPU2, and the third and fourth pixel circuits PXC23 and PXC24 of the second pixel row R2 may be included in the first sub-pixel unit SPU1. Therefore, at least four pixel circuits (e.g., PXC23, PXC24, PXC25, and PXC26) may be disposed between first and second sensor circuits SC11 and SC12 adjacent to each other on the second pixel row R2.

The first sensor circuit SC11 of the second pixel row R2 may be disposed between the second sub-pixel circuit PXC22 of the second pixel row R2 and the third sub-pixel circuit PXC23 of the second pixel row R2. Similarly, the second sensor circuit SC12 of the second pixel row R2 may be disposed between the sixth sub-pixel circuit PXC26 of the second pixel row R2 and the seventh sub-pixel circuit PXC27 of the second pixel row R2.

A first sensor circuit SC21 of the fourth pixel row R4 may be disposed between the second sub-pixel circuit PXC42 of the fourth pixel row R4 and the third sub-pixel circuit PXC43 of the fourth pixel row R4. Similarly, a second sensor circuit SC22 of the fourth pixel row R4 may be disposed between the sixth sub-pixel circuit PXC46 of the fourth pixel row R4 and the seventh sub-pixel circuit PXC47 of the fourth pixel row R4.

Since, in a structure in which the existing photo sensor is integrated together with the pixels PX1, PX2, PX3, and PX4 in the display panel 100, a pixel and a photo sensor are integrated together in the display area AA, the light emitting area of the photo sensor is decreased, and the light receiving area of the photo sensor is insufficient. However, in the display device 1000 in accordance with the embodiments of the present disclosure, the first photo sensor PHS1 may perform sensing, based on light provided from the first to fourth light receiving elements LRD1 to LRD4, so that the number of sensor circuits is decreased. Accordingly, deterioration of the resolution of the display area AA may be minimized. Further, a current generated in the first to fourth light receiving elements LRD1 to LRD4 may be provided to one sensor circuit (e.g., SC11), so that the light receiving amount of the photo sensor may be increased. Accordingly, photo sensing performance may be improved.

However, when only the sensor circuits SC11, SC12, SC21, and SC22 are disposed in the display area AA, an unnecessary extra space (AS shown in FIG. 2) in which the existing sensor circuits are removed may occur. For example, in the extra space AS, scan lines and emission control lines, which are used to drive the first pixel row R1, may be disposed to extend in the first direction DR1 on the first pixel row R1, and scan lines and emission control lines, which are used to drive the second pixel row R2, may overlap the first sensor circuit SC11 on the second row R2. A difference between a capacitance formed in the scan line of the first pixel row R1 and a capacitance formed in the scan line of the second pixel row R2 (e.g., a different in RC load) may occur due to a layout difference of the extra space AS and an area in which the first sensor circuit SC11 are disposed. The difference in capacitance may result in an image quality defect such as a horizontal line blur.

When the first sensor circuit SC11 is formed to extend up to the extra space AS so as to reduce the horizontal line blur, the number of lines (e.g., various scan lines extending in the first direction DR1) overlapping the first sensor circuit SC11 increases, and therefore, influence of coupling on the first sensor circuit SC11 may be increased. The increase in influence of coupling may result in deterioration of the performance of the photo sensor.

In order to solve the above-described problem, dummy sensor circuits DSC11, DSC12, DSC21, and DSC22 may be disposed in the extra space AS. In one embodiment, the dummy sensor circuits DSC11, DSC12, DSC21, and DSC22 may be disposed on the first pixel row R1 and the third pixel row R3. The dummy sensor circuits DSC11, DSC12, DSC21, and DSC22 may overlap with at least portions of predetermined light receiving elements. For example, as shown in FIG. 3, the first dummy sensor circuit DSC11 of the first pixel row R1 may overlap with at least a portion of the first light receiving element LRD1.

However, the dummy sensor circuits DSC11, DSC12, DSC21, and DSC22 are not connected to the light receiving elements LRD1 to LRD4. For example, the dummy sensor circuits DSC11, DSC12, DSC21, and DSC22 do not perform a substantially optical sensing operation. Accordingly, both the horizontal line blur and the deterioration of the performance of the photo sensor, which are described above, may be reduced.

The first dummy sensor circuit DSC11 of the first pixel row R1 may be disposed between the first sub-pixel unit SPU1 and the second sub-pixel unit SPU2, which are included in the pixel unit PU. For example, the first and second pixel circuits PXC11 and PXC12 of the first pixel row R1 may be included in the first sub-pixel unit SPU1, and the third and fourth pixel circuits PXC13 and PXC14 of the first pixel row R1 may be included in the second sub-pixel unit SPU2.

Therefore, at least four pixel circuits (e.g., PXC13, PXC14, PXC15, and PXC16) may be disposed between the first dummy sensor circuit DSC11 and a second dummy sensor circuit DSC12, which are adjacent to each other on the first pixel row R1.

The first dummy sensor circuit DSC11 of the first pixel row R1 may be disposed between the second sub-pixel circuit PXC12 of the first pixel row R1 and the third sub-pixel circuit PXC13 of the first pixel row R1. Similarly, the second dummy sensor circuit DSC12 of the first pixel row R1 may be disposed between the sixth sub-pixel circuit PXC16 of the first pixel row R1 and the seventh sub-pixel circuit PXC17 of the first pixel row R1.

A first dummy sensor circuit DSC21 of the third pixel row R3 may be disposed between the second sub-pixel circuit PXC32 of the third pixel row R3 and the third sub-pixel circuit PXC33 of the third pixel row R3. Similarly, a second dummy sensor circuit DSC22 of the third pixel row R3 may be disposed between the sixth sub-pixel circuit PXC36 of the third pixel row R3 and the seventh sub-pixel circuit PXC37 of the third pixel row R3.

In one embodiment, each of the sensor circuits SC11, SC12, SC21, and SC22 may be adjacent in the second direction DR2 with respect to corresponding dummy sensor circuits DSC11, DSC12, DSC21, and DSC22. In addition, the sensor circuits SC11, SC12, SC21, and SC22 and the dummy sensor circuits DSC11, DSC12, DSC21, and DSC22 may be alternately disposed in the second direction DR2.

In one embodiment, layouts of the sensor circuits SC11, SC12, SC21, and SC22 and the dummy sensor circuits DSC11, DSC12, DSC21, and DSC22 may be similar to each other. Accordingly, a capacitance difference between scan lines of adjacent pixel rows can be minimized, and the horizontal line blur can be reduced.

In one embodiment, the dummy sensor circuits DSC11 to DSC22 and the sensor circuits SC11 to SC22 may not be present in certain parts of the display area AA. For example, a dummy sensor circuit or a sensor circuit may not be present between the fourth sub-pixel circuit PXC14, PXC24, PXC34 or PXC44 of each of the pixel rows R1 to R4 and the fifth sub-pixel circuit PXC15, PXC25, PXC35 or PXC45 of each of the pixel rows R1 to R4, respectively.

Figure 4:
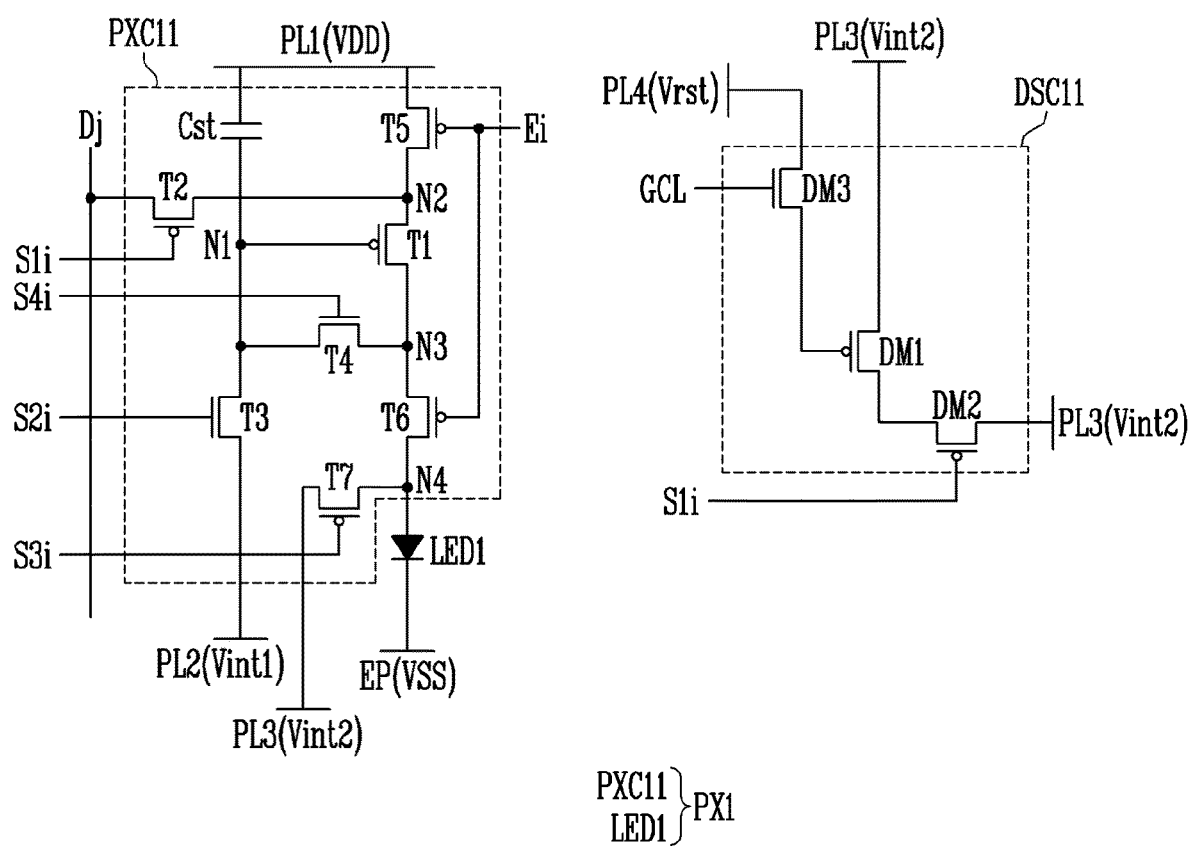
FIG. 4 is a circuit diagram illustrating an example of a pixel and a dummy sensor circuit on a first pixel row shown in FIG. 3.

FIG. 4 is a circuit diagram illustrating an example of the pixel and the dummy sensor circuit on the first pixel row shown in FIG. 3.

Figure 5:
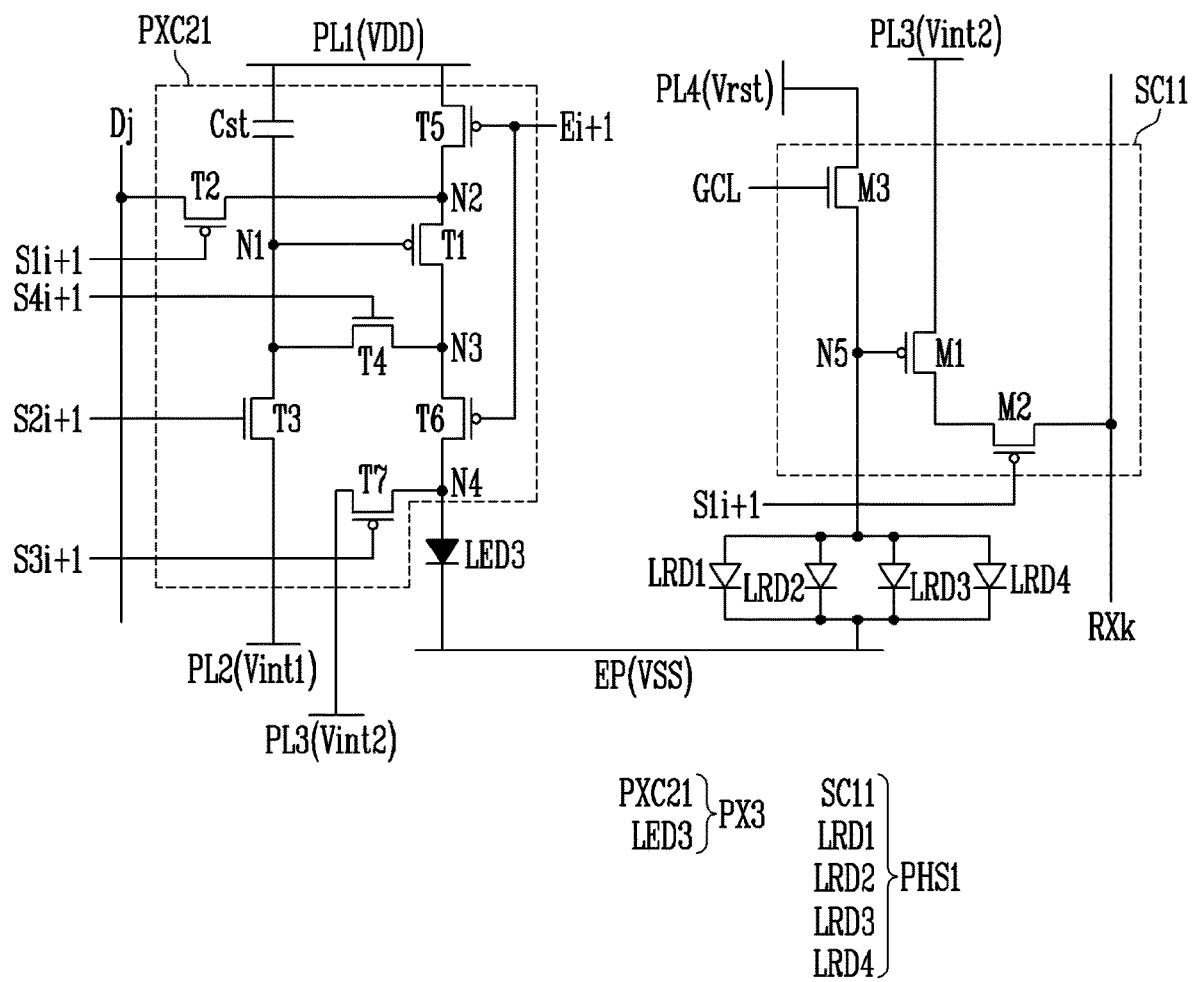
FIG. 5 is a circuit diagram illustrating an example of a pixel and a photo sensor circuit on a second pixel row shown in FIG. 3.

In FIGS. 4 and 5, for convenience of description, a first pixel PX1 which is located on an ith horizontal line (or ith pixel row) and is connected to a jth data line Dj and a third pixel PX3 which is located on an (i+1)th horizontal line and is connected to the jth data line Dj will be illustrated (i and j are natural numbers).

Referring to FIGS. 2, 3, and 4, the first pixel PX1 and a first dummy sensor circuit DSC11 (hereinafter, referred to as a dummy sensor circuit) may be disposed on the ith horizontal line.

The first pixel PX1 may include a first light emitting element LED1 and a first pixel circuit PXC11 (hereinafter, referred to as a pixel circuit). In one embodiment, the pixel circuit PXC11 may include first to seventh pixel transistors T1 to T7 and a storage capacitor Cst.

The first pixel transistor T1 (or driving transistor) may be connected between a first power line PL1 through which a first power voltage VDD is applied and a first electrode of the first light emitting element LED1. The first pixel transistor T1 may include a gate electrode connected to a first node N1.

The first pixel transistor T1 may control an amount of current (or driving current) flowing from the first power line PL1 to an electrode EP through which a second power voltage VSS is provided via the first light emitting element LED1, based on a voltage of the first node N1. To this end, the first power voltage VDD may be set as a voltage higher than the second power voltage VSS.

The second pixel transistor T2 may be connected to the jth data line Dj (hereinafter, referred to as a data line) and a second node N2. A gate electrode of the second pixel transistor T2 may be connected to an ith first scan line S1i. The second pixel transistor T2 may be turned on when a first scan signal is supplied to the ith first scan line S1i, to electrically connect the data line Dj and the second node N2 to each other.

The third pixel transistor T3 may be connected between the first node N1 and a second power line PL2 through which a third power voltage Vint1 (e.g., a first initialization power voltage). A gate electrode of the third pixel transistor T3 may be connected to an ith second scan line S2i. The third pixel transistor T3 may be turned on by a second scan signal supplied to the ith second scan line S2i. When the third pixel transistor T3 is turned on, the third power voltage Vint1 may be supplied to the first node N1 (i.e., the gate electrode of the first pixel transistor T1.

The fourth pixel transistor T4 may be connected between the first node N1 and a third node N3. A gate electrode of the fourth pixel transistor T4 may be connected to an ith fourth scan line S4i. When the fourth pixel transistor T4 is turned on, the first pixel transistor T1 may be connected in a diode form.

The fifth pixel transistor T5 may be connected to the first power line PL1 and the second node N2. A gate electrode of the fifth pixel transistor T5 may be connected to an ith emission control line Ei. The sixth pixel transistor T6 may be connected between the third node N3 and the first light emitting element LED1 (or a fourth node N4). A gate electrode of the sixth pixel transistor T6 may be connected to the ith emission control line Ei. The fifth pixel transistor T5 and the sixth pixel transistor T6 may be turned off when an emission control signal is supplied to the ith emission control line Ei, and be turned on in other cases.

The seventh pixel transistor T7 may be connected between the first electrode of the light emitting element LED1 (i.e., the fourth node N4) and a third power line PL3 through which a fourth power voltage Vint2 (e.g., a second initialization power voltage) is supplied. A gate electrode of the seventh pixel transistor T7 may be connected to an ith third scan line S3i. The seventh pixel transistor T7 may be turned on by a third scan signal supplied to the ith third scan line S3i, to supply the fourth power voltage Vint2 to the first electrode of the light emitting element LED1. In one embodiment, the fourth power voltage Vint2 may be different from the third power voltage Vint1.

The storage capacitor Cst may be connected between the first power line PL1 and the first node N1.

In one embodiment, the first scan signal and the second scan signal may be supplied at different times. In other words, the first scan signal may be supplied after the second scan signal is supplied. For example, the second scan signal and the first scan signal may be supplied at an interval of one horizontal period.

In one embodiment, the third scan signal may be supplied after the first scan signal is supplied. For example, the third scan signal and the first scan signal may be separated timewise by one horizontal period. However, this is merely illustrative, and the third scan signal may be simultaneously supplied with the second scan signal. Alternatively, the third scan signal may be simultaneously supplied with the first scan signal.

The dummy sensor circuit DSC11 may include first to third dummy sensor transistors DM1 to DM3.

The first dummy sensor transistor DM1 may be connected between the third power line PL3 through which the fourth power voltage Vint2 is provided and the second dummy sensor transistor DM2. A gate electrode of the first dummy sensor transistor DM1 may be connected to one electrode of the third dummy transistor DM3.

The second dummy sensor transistor DM2 may be connected between the first dummy sensor transistor DM1 and the third power line PL3. A gate electrode of the second dummy sensor transistor DM2 may be connected to the ith first scan line S1i. For example, the gate electrode of the second dummy sensor transistor DM2 and the gate electrode of the second pixel transistor T2 may share the ith first scan line S1i.

Both ends of the first and second dummy sensor transistors DM1 and DM2 connected in series to each other may be connected to the same third power line PL3, and are not influenced by the dummy sensor circuit DSC11 even when the first scan signal is supplied.

The third dummy sensor transistor DM3 may be connected between a fourth power line PL4 through which a fifth power voltage Vrst is provided and the gate electrode of the first dummy sensor transistor DM1. A gate electrode of the third dummy sensor transistor DM3 may be connected to a control line GCL. The control line GCL is a line commonly connected to dummy sensor circuits and sensor circuits, and may supply a common control signal as a global signal.

Meanwhile, the dummy sensor circuit DSC11 may be insulated from light receiving elements.

In one embodiment, each of the pixel circuit PXC11 and the dummy sensor circuit DSC11 may include P-type and N-type transistors. In one embodiment, the third pixel transistor T3, the fourth pixel transistor T4, and the third dummy sensor transistor DM3 may be implemented with an oxide semiconductor transistor. For example, the third pixel transistor T3, the fourth pixel transistor T4, and the third dummy sensor transistor DM3 may be implemented with an N-type oxide semiconductor transistor, and include an oxide semiconductor layer as an active layer.

The oxide semiconductor transistor can be formed through a low temperature process, and have a charge mobility lower than that of a poly-silicon semiconductor transistor. That is, the oxide semiconductor transistor has an excellent off-current characteristic. Thus, any current leakage at the third pixel transistor T3, the fourth pixel transistor T4, and the third dummy sensor transistor DM3 can be minimized.

The other transistors may be implemented with a poly-silicon transistor, and include a poly-silicon semiconductor layer as an active layer. For example, the active layer may be formed through a low-temperature poly-silicon (LTPS) process. For example, the poly-silicon transistor may be a P-type poly-silicon transistor. Since the poly-silicon semiconductor transistor has a fast response speed, the poly-silicon semiconductor transistor may be applied to a switching element which requires fast switching.

FIG. 5 is a circuit diagram illustrating an example of a pixel and a photo sensor circuit on the second pixel row shown in FIG. 3.

Referring to FIGS. 2, 3, 4, and 5, the third pixel PX3 and a first sensor circuit SC11 (hereinafter, referred to as a sensor circuit) may be disposed on the (i+1)th horizontal line.

The third pixel PX3 may include a third light emitting element LED3 and a pixel circuit PXC21. In one embodiment, the pixel circuit PXC21 may include first to seventh pixel transistors T1 to T7 and a storage capacitor Cst.

The pixel circuits PXC11 and PXC21 are configured substantially identical to each other, except that the pixel circuit PXC21 is connected to (i+1)th scan lines and an emission control line S1i+1, S2i+1, S3i+1, S4i+1, and Ei+1, and therefore, overlapping descriptions will be omitted.

The sensor circuit SC11 may include first to third sensor transistors M1 to M3.

The first and second sensor transistors M1 and M2 may be connected in series between the third power line PL3 and a kth readout line Rxk (k is a natural number). In one embodiment, a gate electrode of the first sensor transistor M1 may be connected to a fifth node N5, and a gate electrode of the second sensor transistor M2 and a gate electrode of the second pixel transistor T2 may share an (i+1)th first scan line S1i+1.

The third sensor transistor M3 may be connected between the fourth power line PL4 and the fifth node N5. A gate electrode of the third sensor transistor M3 may be connected to the control line GCL. In one embodiment, the third sensor transistor M3 may be an N-type oxide semiconductor transistor.

In one embodiment, first to fourth light receiving elements LRD1 to LRD4 may be connected in parallel between the fifth node N5 and the electrode EP through which the second power voltage VSS is provided. Therefore, when the third sensor transistor M3 is turned on by the control signal supplied to the control line GCL, a current path between the fourth power line PL4 and the electrode EP may be formed by light incident onto the first to fourth light receiving elements LRD1 to LRD4, and a voltage of the fifth node N5 may be changed. When the second sensor transistor M2 is turned on by the first scan signal, a detection value (current and/or voltage) generated based on the voltage of the fifth node N5 may flow in the readout line Rxk. In one embodiment, the fifth power voltage Vrst may be set as a voltage higher than the second power voltage VSS.

As described above, the sensor circuit SC11 and the first to fourth light receiving elements LRD1 to LRD4 connected thereto may constitute a first photo sensor PHS1. Thus, the light receiving amount and sensing performance of the first photo sensor PHS1 can be improved.

Figure 6:
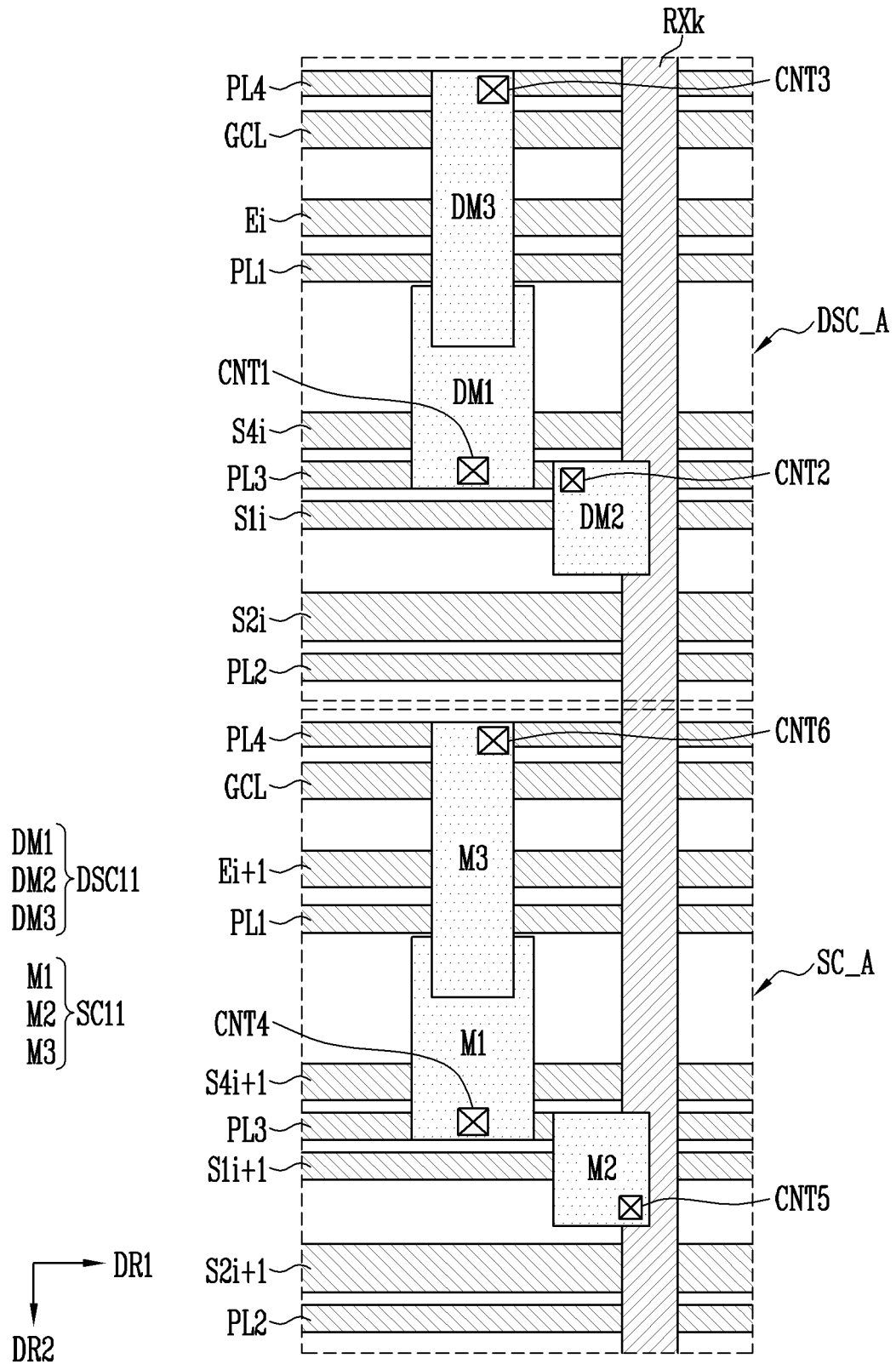
FIG. 6 is a diagram illustrating an example of lines and transistors, which are disposed in a dummy sensor circuit area and a sensor circuit area.

FIG. 6 is a diagram illustrating an example of lines and transistors, which are disposed in a dummy sensor circuit area and a sensor circuit area.

Referring to FIGS. 2, 3, 4, 5, and 6, planar layout structures of transistors and lines of a dummy sensor area DSC_A and a sensor circuit area SC_A may be similar to each other.

A dummy sensor circuit DSC11 including first to third dummy sensor transistors DM1 to DM3 may be disposed (or formed) in the dummy sensor circuit area DSC_A. Also, an ith first scan line S1$i$, an ith second scan line S2$i$, an ith fourth scan line S4$i$, and an ith emission control line Ei may extend in the first direction DR1 in the dummy sensor circuit area DSC_A. First to fourth power lines PL1 to PL4 and a control line GCL may also extend in the first direction DR1 in the dummy sensor circuit area DSC_A. A kth readout line Rxk may extend in the second direction DR2, and be formed throughout the dummy sensor circuit area DSC_A and the sensor circuit area SC_A.

The first dummy sensor transistor DM1 may be connected to the third power line PL3 through a first contact hole CNT1. A gate electrode of the first dummy sensor transistor DM1 may extend to the third dummy transistor MD3.

The second dummy sensor transistor DM2 may be connected to the third power line PL3 through a second contact hole CNT2.

The third dummy sensor transistor DM3 may be connected to the fourth power line PL4 through a third contact hole CNT3.

A sensor circuit SC11 including first to third sensor transistors M1 to M3 may be disposed (or formed) in the sensor circuit area SC_A. An (i+1)th first scan line S1$i$+1, an (i+1)th second scan line S2$i$+1, an (i+1)th fourth scan line S4$i$+1, and an (i+1)th emission control line Ei+1 may extend in the first direction DR1 in the sensor circuit areas SC_A. First to fourth power lines PL1 to PL4 and a control line GCL, through which the same power voltages are commonly transferred with the first to fourth power lines PL1 to PL4 and the control line GCL, which extend from the dummy sensor circuit area DSC_A, may also extend in the first direction DR1 in the sensor circuit area SC_A.

The first sensor transistor M1 may be connected to the third power line PL3 through a fourth contact hole CNT4. In addition, a gate electrode of the first sensor transistor M1 may extend to the third sensor transistor M3.

The second sensor transistor M2 may be connected to the kth readout line Rxk through a fifth contact hole CNT5.

The third sensor transistor M3 may be connected to the fourth power line PL4 through a sixth contact hole CNT6.

As described above, circuit and line layouts of the dummy sensor circuit area DSC_A and the sensor circuit area SC_A are designed similarly to each other, so that a capacitance deviation (e.g., an RC load) between the ith first scan line S1$i$ and the (i+1)th first scan line S1$i$+1 can be minimized. Thus, the horizontal line blur can be reduced.

Further, each of the first and second dummy transistors DM1 and DM2 is electrically and physically connected to the third power line PL3, so that influence on optical sensing of the dummy sensor circuit DSC11 can be removed and/or prevented.

In FIG. 6, the third scan lines S3$i$ and S3$i$+1 are omitted. For example, the third scan lines S3$i$ and S3$i$+1 may be commonly used respectively with the first scan lines S1$i$ and S1$i$+1.

Figure 7:
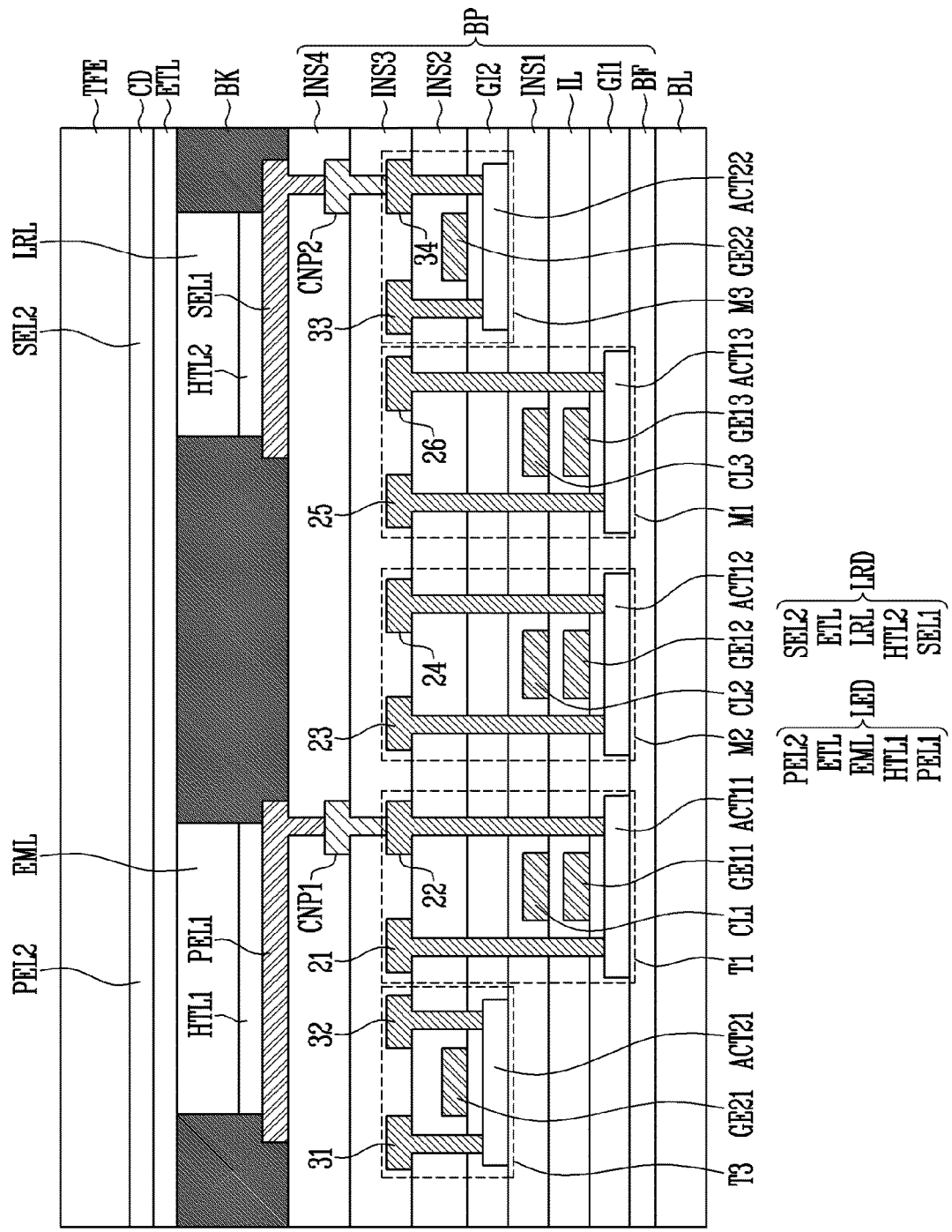
FIG. 7 is a sectional view illustrating an example of the display area shown in FIG. 3.

FIG. 7 is a sectional view illustrating an example of the display area shown in FIG. 3.

Referring to FIGS. 1, 3, 5, and 7, pixel transistors T1 to T7, dummy sensor transistors DM1 to DM3, and sensor transistors M1 to M3 may be included in a backplane structure BP of the display panel 100.

FIG. 7 shows a first pixel transistor T1, a third pixel transistor T3, a first sensor transistor M1, a second sensor transistor M2, and a third sensor transistor M3.

A base layer BL may be made of an insulative material such as glass or resin. The base layer BL may be made of a material having flexibility to be bendable or foldable, and have a single- or multi-layered structure.

The backplane structure BP including the pixel circuit PXC, the dummy sensor circuit DSC11, and the sensor circuit SC11 may be provided on the base layer BL. The backplane structure BP may include a semiconductor layer, a plurality of conductive layers, and a plurality of insulating layers, which will be described later.

A buffer layer BF may be formed on the base layer BL. The buffer layer BF may prevent an impurity from being diffused into the transistors T1 and M1. The buffer layer BF may be omitted according to the material and process conditions of the base layer BL.

First to third active patterns ACT11, ACT12, and ACT13 may be provided on the buffer layer BF. In one embodiment, the first to third active patterns ACT11, ACT12, and ACT13 may be formed of a poly-silicon semiconductor. For example, the first to third active patterns ACT11, ACT12, and ACT13 may be formed through a low-temperature poly-silicon (LTPS) process.

A first gate insulating layer GI1 may be provided on the first to third active patterns ACT11, ACT12, and ACT13. The first gate insulating layer GI1 may be an inorganic insulating layer made of an inorganic material.

First to third gate electrodes GE11, GE12, and GE13 may be provided on the first gate insulating layer GI1. The first gate electrode GE11 may overlap with a channel region of the first active pattern ACT11, the second gate electrode GE12 may overlap with a channel region of the second active pattern ACT12, and the third gate electrode GE13 may overlap with a channel region of the third active pattern ACT13.

The first to third gate electrodes GE11, GE12, and GE13 may be made of a metal. For example, the first to third gate electrodes GE11, GE12, and GE13 may be made of at least one of metals such as gold (Au), silver (Ag), aluminum (Al), molybdenum (Mo), chromium (Cr), titanium (Ti), nickel (Ni), neodymium (Nd), and copper (Cu), or alloys thereof. Also, each of the first to third gate electrodes GE11, GE12, and GE13 may be formed as a single layer or a multi-layer in which two or more of the metals and the alloys are stacked.

An interlayer insulating layer IL may be provided to cover the first to third gate electrodes GE11, GE12, and GE13. The interlayer insulating layer IL may be an inorganic insulating layer made of an inorganic material. The inorganic material may include polysiloxane, silicon nitride, silicon oxide, silicon oxynitride, etc.

Conductive patterns CL1, CL2, and CL3 may be provided on the interlayer insulating layer IL. The conductive patterns CL1, CL2, and CL3 may form at least one of one electrode of the storage capacitor Cst, the scan lines S1$i$+1 to S4$i$+4, the data line Dj, the control line GCL, the readout line Rxk, and the power lines PL1 to PL4.

The conductive patterns CL1, CL2, and CL3 may be made of at least one of metals such as gold (Au), silver (Ag), aluminum (Al), molybdenum (Mo), chromium (Cr), titanium (Ti), nickel (Ni), neodymium (Nd), and copper (Cu), or alloys thereof. Also, the conductive patterns CL1, CL2, and CL3 may be formed as a single layer. However, the present disclosure is not limited thereto, and the conductive patterns CL1, CL2, and CL3 may be formed as a single layer or a multi-layer in which two or more of the metals and the alloys are stacked.

A first insulating layer INS1 may be provided over the conductive patterns CL1, CL2, and CL3. The first insulating layer INS may be an inorganic insulating layer made of an inorganic material. The inorganic material may include polysiloxane, silicon nitride, silicon oxide, silicon oxynitride, etc.

A fourth active pattern ACT21 and a fifth active pattern ACT22 may be provided on the first insulating layer INS1. In one embodiment, the fourth and fifth active patterns ACT21 and ACT22 may be formed of an oxide semiconductor. For example, the fourth and fifth active patterns ACT21 and ACT22 may be formed through a metal oxide semiconductor forming process.

A second gate insulating layer G12 may be provided over the fourth active pattern ACT21 and the fifth active pattern ACT22. The second gate insulating layer G12 may be an inorganic insulating layer made of an inorganic material.

Fourth and fifth gate electrodes GE21 and GE22 may be provided on the second gate insulating layer G12. The fourth gate electrode GE21 may overlap with a channel region of the fourth active pattern ACT21, and the fifth gate electrode GE22 may overlap with a channel region of the fifth active pattern ACT22.

A second insulating layer INS2 may be provided over the fourth and fifth gate electrodes GE21 and GE22. For example, the second insulating layer INS2 may be an inorganic insulating layer made of an inorganic material.

First source/drain electrodes 21 and 22, second source/drain electrodes 23 and 24, third source/drain electrodes 25 and 26, fourth source/drain electrode 31 and 32, and fifth source/drain electrodes 33 and 34 may be provided on the second insulating layer INS2. The first to fifth source/drain electrodes 21, 22, 23, 24, 25, 26, 31, 32, 33, and 34 may be connected to the first to fifth active patterns ACT11, ACT12, ACT13, ACT21 and ACT22 corresponding thereto through contact holes, respectively.

The first to fifth source/drain electrodes 21, 22, 23, 24, 25, 26, 31, 32, 33, and 34 may be made of a metal.

A third insulating layer INS3 may be provided over the first to fifth source/drain electrodes 21, 22, 23, 24, 25, 26, 31, 32, 33, and 34. For example, the third insulating layer INS3 may be an inorganic insulating layer made of an inorganic material.

Connection patterns CNP1 and CNP2 may be provided on the third insulating layer INS3. A first connection pattern CNP1 may be connected to the first drain electrode 22 through a contact hole penetrating the third insulating layer INS3. A second connection pattern CNP2 may be connected to the fifth source electrode 34 (or the fifth drains electrode 33).

The connection patterns CNP1 and CNP2 may be made of at least one of metals such as gold (Au), silver (Ag), aluminum (Al), molybdenum (Mo), chromium (Cr), titanium (Ti), nickel (Ni), neodymium (Nd), and copper (Cu), or alloys thereof.

A fourth insulating layer INS4 may be disposed over the connection patterns CNP1 and CNP2. The fourth insulating layer INS4 may be an organic insulating layer made of an organic material or an inorganic insulating layer made of an inorganic material. In one embodiment, the fourth insulating layer INS4 may serve as a planarization layer.

A pixel layer including a first pixel electrode PEL1, a first sensor electrode SEL1, and a bank layer BK may be provided on the fourth insulating layer INS4.

The pixel layer may include a light emitting element LED connected to the pixel circuit PXC11 and a light receiving element LRD connected to the sensor circuit SC11.

In one embodiment, the light emitting element LED may include the first pixel electrode PEL1, a first hole transport layer HTL1, a light emitting layer EML, an electron transport layer ETL, and a second pixel electrode PEL2. In one embodiment, the light receiving element LRD may include the first sensor electrode SEL1, a second hole transport layer HTL2, a light receiving layer LRL, the electron transport layer ETL, and a second sensor electrode SEL2.

In one embodiment, the first pixel electrode PEL1 and the first sensor electrode SEL1 may be made of a metal such as Ag, Mg, Al, Pt, Pd, Au, Ni, Nd, Ir, Cr, or any alloy thereof, and/or indium tin oxide (ITO), indium zinc oxide (IZO), zinc oxide (ZnO), indium tin zinc oxide (ITZO), etc. The first pixel electrode PEL1 may be connected to the first drain electrode 22 through a contact hole. The first sensor electrode SEL1 may be connected to the fifth drain electrode 34 through a contact hole.

The first pixel electrode PEL1 and the first sensor electrode SEL1 may be simultaneously formed through patterning using a mask.

The bank layer BK (or pixel defining layer) defining a light emitting area and a light receiving area may be provided on the fourth insulating layer INS4 on which the first pixel electrode PEL1 and the first sensor electrode SEL1 are formed. The bank layer BK may be an organic insulating layer made of an organic material. The organic material may include acryl resin, epoxy resin, phenolic resin, polyamide resin, polyimide resin, etc.

Also, the bank layer BK may include light absorption material or have a light absorber coated thereon, to absorb light introduced from the outside. For example, the bank layer BK may include a carbon-based black pigment. However, the present disclosure is not limited thereto. The bank layer BK may include an opaque metal material such as chromium (Cr), molybdenum (Mo), an alloy (MoTi) of molybdenum and titanium, tungsten (W), vanadium (V), niobium (Nb), tantalum (Ta), manganese (Mn), cobalt (Co) or nickel (Ni), which has a high light absorption rate.

The bank layer BK may include openings corresponding to the light emitting area and a light receiving area.

The first hole transport layer HTL1 may be provided on the top surface of the first pixel electrode PEL1, which is exposed by the bank layer BK, and the second hole transport layer HTL2 may be provided on the top surface of the first sensor electrode SEL1. Holes may be moved to the light emitting layer EML through the first hole transport layer HTL1, and holes may be moved to the light receiving layer LRL through the second hole transport layer HTL2.

In one embodiment, the first hole transport layer HTL1 and the second hole transport layer HTL2 may be the same or be different from each other according to materials of the light emitting layer EML and the light receiving layer LRL.

The light emitting layer EML may be provided on the first hole transport layer HTL1. In one embodiment, the light emitting layer EML may be an organic light emitting layer.

The light emitting layer EML may emit light such as red light, green light, or blue light according to an organic material included in the light emitting layer EML.

In one embodiment, an electron blocking layer may be provided on the second hole transport layer HTL2 in the light receiving area. The electron blocking layer may block charges of the light receiving layer LRL from moving to the second hole transport layer HTL2. In one embodiment, the electron blocking layer may be omitted. The light receiving layer LRL may be disposed on the second hole transport layer HTL2. The light receiving layer LRL emits electrons, corresponding to light of a specific wavelength band, to sense an intensity of the light.

In one embodiment, the light receiving layer LRL may include a low molecular organic material. For example, the light receiving layer LRL may be made of a phthalocyanine compound including at least one metal selected from the group consisting of copper (Cu), iron (Fe), nickel (Ni), cobalt (Co), manganese (Mn), aluminum (Al), palladium (Pd), tin (Sn), indium (In), lead (Pb), titanium (Ti), rubidium (Rb), vanadium (V), gallium (Ga), terbium (Tb), cerium (Ce), lanthanum (La), and zinc (Zn).

Alternatively, the low molecular organic material included in the light receiving layer LRL may have a bi-layered structure including a layer comprising a layer including a phthalocyanine compound including at least one metal selected from the group consisting of copper (Cu), iron (Fe), nickel (Ni), cobalt (Co), manganese (Mn), aluminum (Al), palladium (Pd), tin (Sn), indium (In), lead (Pb), titanium (Ti), rubidium (Rb), vanadium (V), gallium (Ga), terbium (Tb), cerium (Ce), lanthanum (La), and zinc (Zn), and a layer including C60. Alternatively, the low molecular organic material included in the light receiving layer LRL may have a single-layered structure in which a phthalocyanine compound and C60 are mixed.

However, the above list of compounds and materials is merely illustrative, and the light receiving layer LRL may include a high molecular organic layer.

In one embodiment, the light receiving layer LRL may determine a light detection band by controlling selection of a metal component included in the phthalocyanine compound. For example, the phthalocyanine compound including copper absorbs a visible light wavelength of a band of about 600 nm to about 800 nm. The phthalocyanine compound including tin (Sn) absorbs a near-infrared light wavelength of a band of about 800 nm to 1000 nm. Therefore, the selection of a metal included in the phthalocyanine compound is controlled, so that a photo sensor capable of detecting a wavelength of a band required by a user can be implemented. For example, the light receiving layer LRL may be formed to selectively absorb a wavelength of a red light band, a wavelength of a green light band, or a wavelength of a blue light band.

In one embodiment, an area of the light receiving area RA may be smaller than that of the light emitting area EA.

The second pixel electrode PEL2 and the second sensor electrode SEL2 may be provided on the electron transport layer ETL. In one embodiment, the second pixel electrode PEL2 and the second sensor electrode SEL2 may be a common electrode CD in which the second pixel electrode PEL2 and the second sensor electrode SEL2 are integrally formed on the display area AA. The second power voltage VSS may be supplied to the second pixel electrode PEL2 and the second sensor electrode SEL2.

The common electrode CD may be a metal layer such as Ag, Mg, Al, Pt, Pd, Au, Ni, Nd, Ir or Cr, and/or a transparent conductive layer such as ITO, IZO, ZnO or ITZO. In one embodiment, the common electrode CD may be a double-layer or multi-layer including a metal thin film. For example, the common electrode CD may be a triple-layer of ITO/Ag/ITO.

An encapsulation layer TFE may be provided on the common electrode CD including the second pixel electrode PEL2 and the second sensor electrode SEL2. The encapsulation layer TFE may have a single layer structure or a multi-layer structure. In one embodiment, the encapsulation layer TFE may have a stack structure in which an inorganic material, an organic material, and an inorganic material are sequentially stacked in that order. An uppermost layer of the encapsulation layer may be formed of an inorganic material.

Figure 8:
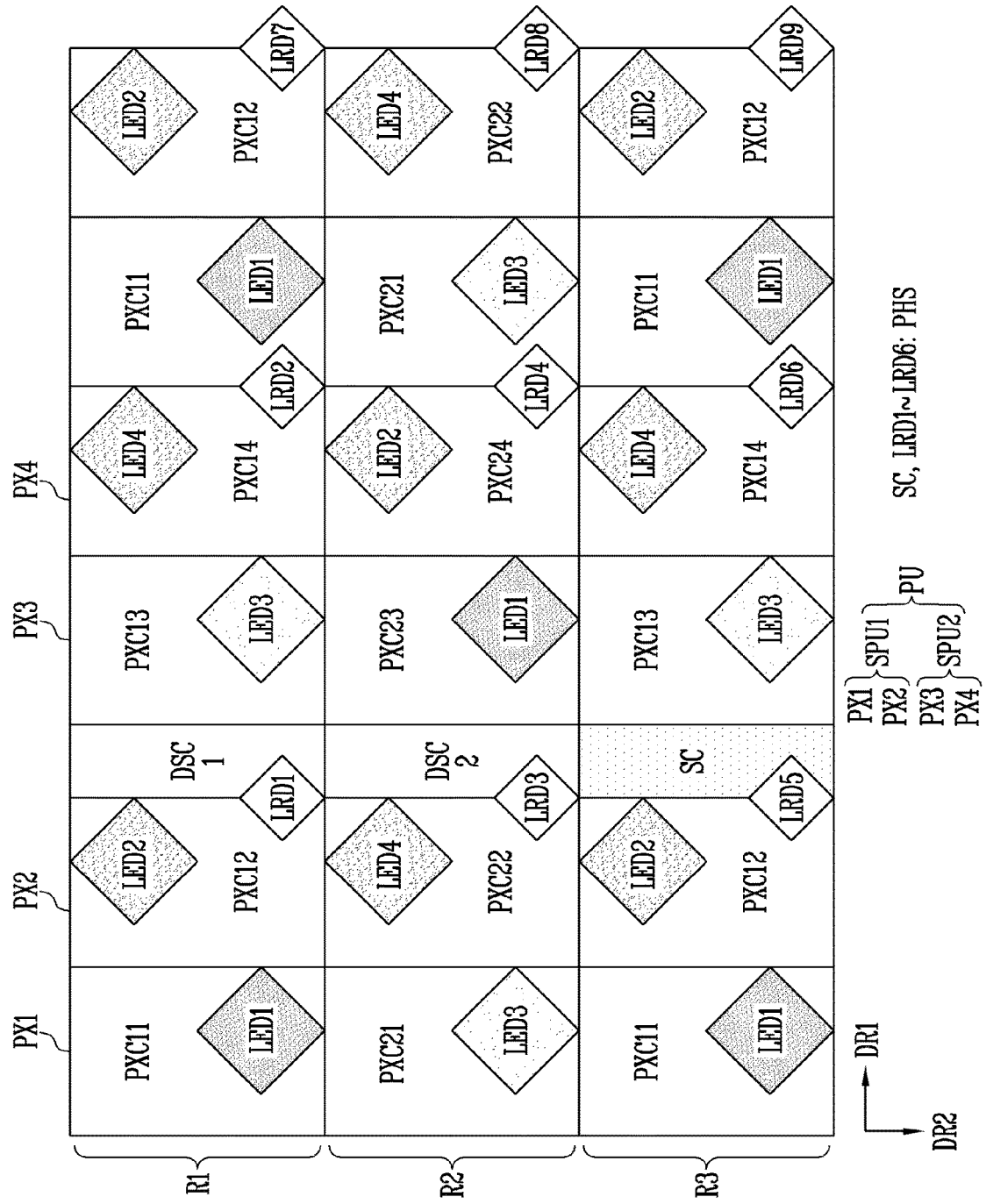
FIG. 8 is a diagram illustrating an example of the display area of the display panel included in the display device shown in FIG. 1.

FIG. 8 is a diagram illustrating an example of the display area of the display panel included in the display device shown in FIG. 1.

Referring to FIG. 8, a sensor circuit SC may be disposed on a third pixel row R3.

In one embodiment, the sensor circuit SC may be arranged for every 3pth (p is a natural number) pixel row. For example, the sensor circuit SC may be disposed on the third pixel row R3, a sixth pixel row R6, a ninth pixel row R9, and the like. Therefore, a first dummy sensor circuit DSC1 may be disposed on a first pixel row R1, and a second dummy sensor circuit DSC2 may be disposed on a second pixel row R2.

The sensor circuit SC and the dummy sensor circuits DSC1 and DSC2 have been described in detail with reference to FIGS. 4 and 5, and therefore, redundant descriptions will be omitted.

First to sixth light receiving elements LRD1 to LRD6 may be connected to the sensor circuit SC. Thus, a photo sensor PHS includes the first to sixth light receiving elements LRD1 to LRD6 and the sensor circuit SC connected thereto, and the light receiving amount can be further increased.

However, this is merely illustrative, and the sensor circuit SC may be connected to first to ninth light receiving elements LRD1 to LRD9 according to an arrangement rule in the first direction DR1. In addition, two or more pixel rows may be located between adjacent sensor circuits SC in the second direction DR2. For example, the sensor circuit SC may be arranged for every 4th pixel row.

As described above, in the display device in accordance with the embodiments of the present disclosure, four or more light receiving elements may be connected to one sensor circuit formed in the backplane structure, so that the light receiving amount of the photo sensor may be increased while minimizing deterioration of a display resolution. Accordingly, the optical sensing performance of the display device may be improved.

Further, a dummy sensor circuit having a structure similar to that of the sensor circuit may be disposed in an area in which the existing sensor circuit is removed. Accordingly, the blurring of a horizontal line caused by a capacitance difference between scan lines for data signal writing may be reduced, and the image quality of display device may be improved while improving the optical sensing performance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present disclosure as set forth in the following claims.

What is claimed is:

1. A display device comprising:
   a plurality of pixel circuits disposed in each of an ith (i is a natural number) pixel row and an (i+1)th pixel row;
   a dummy sensor circuit disposed between two pixel circuits located in different columns among the plurality of pixel circuits of the ith pixel row;
   a sensor circuit disposed between two pixel circuits located in different columns among the plurality of pixel circuits of the (i+1)th pixel row;
   a bank layer disposed on a backplane structure where the plurality of pixel circuits, the dummy sensor circuit, and the sensor circuit are located, and including a plurality of openings;
   a plurality of light emitting elements connected to each of the plurality of pixel circuits and disposed in openings corresponding to a light emitting area among the plurality of openings; and
   a plurality of light receiving elements connected to the sensor circuit and disposed in openings corresponding to a light receiving area among the plurality of openings,
   wherein the dummy sensor circuit is not connected to any of the plurality of light receiving elements.

2. The display device of claim 1, wherein the plurality of light receiving elements comprises a first light receiving element and a second light receiving element,
   wherein the first light receiving element overlaps the dummy sensor circuit, and
   wherein the second light receiving element overlaps the sensor circuit.

3. The display device of claim 1, wherein each of the plurality of pixel circuits disposed in the ith pixel row and the (i+1)th pixel row comprises:
   a first pixel transistor receiving a first power voltage from a first power line;
   a second pixel transistor connected between a data line and a first electrode of the first pixel transistor, and including a gate electrode connected to a corresponding first scan line; and
   a third pixel transistor connected between a gate electrode of the first pixel transistor and a second power line through which a second power voltage is provided.

4. The display device of claim 3, wherein the plurality of light receiving elements comprises a first light receiving element and a second light receiving element, and
   wherein the sensor circuit comprises:
   a first sensor transistor including a gate electrode connected to the first light receiving element and the second light receiving element;
   a second sensor transistor connected between the first sensor transistor and a readout line; and
   a third sensor transistor including a gate electrode, wherein the gate electrode of the third sensor transistor is connected to the gate electrode of the first sensor transistor, the first light receiving element, and the second light receiving element.

5. The display device of claim 4, wherein the dummy sensor circuit comprises:
   a first dummy sensor transistor;
   a second dummy sensor transistor connected between the first dummy sensor transistor and a third power line through which a third power voltage is provided; and
   a third dummy sensor transistor connected between a fourth power line through which a fourth power voltage is provided and a gate electrode of the first dummy sensor transistor, wherein the third dummy sensor transistor includes a gate electrode connected to a control line.

6. The display device of claim 5, wherein an ith first scan line is connected to the second transistor disposed in the first pixel row and the second dummy sensor transistor, and
   wherein an (i+1)th first scan line is connected to the second transistor disposed in the second pixel row and the second sensor transistor.

7. The display device of claim 5, wherein each of the plurality of light emitting elements disposed in each of the ith pixel row and the (i+1)th pixel row includes a first electrode, and
   wherein the third power voltage is applied to the first electrode of each of the plurality of light emitting elements.

8. The display device of claim 1, wherein one of the plurality of light receiving elements connected to the sensor circuit overlaps a pixel circuit in the ith pixel row and the dummy sensor circuit, and
   wherein another one of the plurality of light receiving elements connected to the sensor circuit overlaps different pixel circuits in the ith pixel row.

9. The display device of claim 1, wherein the sensor circuit comprises:
   a first sensor transistor including a gate electrode and connected to the power line;
   a second sensor transistor connected between the first sensor transistor and a readout line; and
   a third sensor transistor including a gate electrode connected to a control line, and connected to the gate electrode of the first sensor transistor,
   wherein the dummy sensor circuit comprises:
   a first dummy sensor transistor including a gate electrode and connected to the power line;
   a second dummy sensor transistor connected between the first dummy sensor transistor and the power line; and
   a third dummy sensor transistor including a gate electrode connected to the control line, and connected to the gate electrode of the first dummy sensor transistor.

10. A display device comprising:
    a power line to which a power voltage is applied;
    a plurality of pixel circuits disposed in each of an ith (i is a natural number) pixel row and an (i+1)th pixel row;
    a dummy sensor circuit disposed between two pixel circuits located in different columns among the plurality of pixel circuits of the ith pixel row; and
    a sensor circuit disposed between two pixel circuits located in different columns among the plurality of pixel circuits of the (i+1)th pixel row,
    wherein the sensor circuit comprises:
    a first sensor transistor including a gate electrode and connected to the power line;
    a second sensor transistor connected between the first sensor transistor and a readout line; and
    a third sensor transistor including a gate electrode connected to a control line, and connected to the gate electrode of the first sensor transistor, and
    wherein the dummy sensor circuit comprises:
    a first dummy sensor transistor including a gate electrode and connected to the power line;
    a second dummy sensor transistor connected between the first dummy sensor transistor and the power line; and a third dummy sensor transistor including a gate electrode connected to the control line and connected to the gate electrode of the first dummy sensor transistor.

11. The display device of claim 10, wherein the display device further comprises:
   a bank layer disposed on a backplane structure where the plurality of pixel circuits, the dummy sensor circuit, and the sensor circuit are located, and including a plurality of openings;
   a plurality of light emitting elements connected to each of the plurality of pixel circuits and disposed in openings corresponding to a light emitting area among the plurality of openings; and
   a plurality of light receiving elements connected to the sensor circuit and disposed in openings corresponding to a light receiving area among the plurality of openings, and
   wherein the dummy sensor circuit is not connected to any of the plurality of light receiving elements.

12. The display device of claim 11, wherein the gate electrode of the first sensor transistor is connected to the plurality of light receiving elements.

13. The display device of claim 11, wherein each of the plurality of light emitting elements includes a first electrode, and
   wherein the power voltage is applied to the first electrode of each of the plurality of light emitting elements.

14. The display device of claim 13, wherein the power line to which the power voltage is applied is a third power line to which a fourth power voltage is applied,
   wherein each of the plurality of light emitting elements further includes an electrode to which a second power supply voltage is provided, and
   wherein the third sensor transistor and the third dummy sensor transistor are further connected to a fourth power line to which a fifth power voltage is applied, and
   the fifth power voltage is a voltage higher than the second power voltage.

* * * * *